United States Patent
Ray

(10) Patent No.: US 6,301,837 B1
(45) Date of Patent: Oct. 16, 2001

(54) RACK ASSEMBLY FOR SUPPORTING ELECTRONIC UNITS

(75) Inventor: Jay D. Ray, Saratoga, CA (US)

(73) Assignee: Kewaunee Scientific Corp., Statesville, NC (US)

( * ) Notice: Subject to any disclaimer, the term of this patent is extended or adjusted under 35 U.S.C. 154(b) by 0 days.

(21) Appl. No.: 09/584,589

(22) Filed: May 31, 2000

Related U.S. Application Data

(60) Provisional application No. 60/188,951, filed on Mar. 13, 2000.

(51) Int. Cl.[7] .............................. E04F 19/00; E04H 14/00
(52) U.S. Cl. .................................. 52/27; 52/29; 52/36.4; 52/263; 211/26; 211/189
(58) Field of Search ................................ 52/27, 29, 36.4, 52/263; 211/26, 189

(56) References Cited

U.S. PATENT DOCUMENTS 5,683,001 * 11/1997 Masuda .................................. 211/26
6,123,203 * 7/1999 Gibbons ................................. 211/26

OTHER PUBLICATIONS

Product brochure, The Contracktor Series™, Relay Racks Zero PFT, Monon, IN 47959, Catalog No. CONT1984DA BCM19, with technical data sheet.
Product brochure, The Contracktor Series™, Smart Design™, PFT A Zero Corporation Company, CS997.

* cited by examiner

Primary Examiner—Carl D. Friedman
Assistant Examiner—Chi Nguyen
(74) Attorney, Agent, or Firm—Kennedy Covington Lobdell & Hickman, LLP

(57) ABSTRACT

A rack assembly for supporting electronic units which includes a generally rectangular frame having reinforcing plates welded thereto to extend outwardly therefrom, and a reinforced mounting portion disposed at the lower end of the frame and having a length corresponding generally to the height of the vertical spacing between a permanent floor and secondary flooring disposed above the permanent flooring so that the mounting portion can be secured directly to the permanent flooring and pass upwardly through an opening in the secondary flooring. A plurality of the rack assemblies may be arranged in side-by-side relationship in a room, and the reinforcing plates of adjacent rack assemblies provide wire management channels.

26 Claims, 4 Drawing Sheets

RACK ASSEMBLY FOR SUPPORTING ELECTRONIC UNITS

This application is based on U.S. Provisional Application No. 60/188,951 to Jay D. Ray, filed Mar. 13, 2000, for SEISMIC EQUIPMENT RACK.

BACKGROUND OF THE INVENTION

The present invention relates generally to racks for supporting self-contained units, and more particularly to rack assemblies of this type which are used to support electronic units such as, for example, electronic internet server units.

In general, racks designed for this purpose include a rectangular frame that extends vertically upwardly from the floor, and the sides of the frame are provided with apertures or openings for receiving screws and the like which are used to mount a plurality of the electronic units in the frame so that they are vertically stacked in close proximity to one another to conserve space. Usually, each electronic unit is self-contained, operates independently of the other units, and requires its own wiring. For example, it is common practice for one company to maintain a large number of internet server units in one room, with each such unit being wired directly to the company which controls the internet server contained within that unit. It will be understood that the number of electronic units that are placed within a rack will vary significantly depending on the vertical height of the rack and the vertical dimensions of the electronic units, but in a representative rack housing internet server units, there may be approximately five units mounted in a single rack.

Since the electronic units will generally house sensitive electronic equipment, it is important that the racks be mounted in place so that the electronics units are not subjected to undue movement or vibration which could render the unit inoperative. Accordingly, most racks of this type are mounted directly to the raised or secondary flooring of a room (e.g. a floor formed by tiles held in place in a metal frame) by foot members that rest on top of the secondary flooring, and long bolts or the like are passed through the foot members and the secondary flooring so that they can be anchored to a primary floor (e.g. concrete flooring) located below the secondary flooring in spaced relation thereto to provide a vertical space for containing wiring, ductwork, and other construction elements, all as well known in the construction industry.

While these known racks are generally secure enough to properly support sensitive electronic units under normal conditions, they are woefully inadequate if there is an abnormal condition, such as an earthquake of a certain size somewhere in the vicinity of the room in which the racks are housed. Under these conditions, the secondary flooring to which the racks are directly connected and which are relatively lightweight and thin in construction, will often buckle or collapse to an extent that the racks secured thereto will also collapse, become twisted, or otherwise be moved to an extent that the sensitive electronic elements supported within the racks will be rendered inoperative. This problem is exacerbated by the fact that these known racks are usually made primarily from aluminum, and at least some of the components of the rack are usually bolted together, all of which creates a somewhat flimsy rack structure.

One effort to solve the problem of properly supporting the racks under these adverse conditions has been to build a specially designed seismic bracing cage that surrounds the rack and adds additional support to the rack, but this is an expensive remedy, both in terms of material and installation costs, and it increases the floor space required to accommodate each rack supported in this manner.

Since it will be understood that racks of this type are being utilized in very large numbers in Silicon Valley and other areas which are prone to experience earthquakes at periodic intervals, and since each of these racks contains a substantial number of independent electronic units upon which many different companies may depend on a daily basis, the seriousness of this problem will be readily apparent.

Additionally, the procedure for installing racks of this general type is relatively complicated. More specifically, in a typical installation, a plurality of the racks are brought to the room in which they are to be installed, and they are temporarily lined up at their expected positions on the secondary flooring so that the secondary flooring can be appropriately marked with indicia showing where all of the connecting bolts will be located. The racks are then moved away, and appropriate floor tiles are removed from the metal frame in which they are mounted so that they can be drilled with holes at the locations indicated by the markings. It is also then necessary to place markings on the concrete primary flooring at each location at which one of the long mounting bolts or all-threads are to be anchored, and since these markings obviously must be coordinated with the holes drilled in the tiles, it is usually necessary to reinstall the tiles and use the holes in the tiles as guides for installing concrete anchors and all-threads in the concrete flooring. Then, the floor tiles are put back in place and the racks are bolted to the floor tiles and to the concrete flooring. Thus, this installation procedure is very time consuming, labor intensive and, therefore, expensive.

Accordingly, known racks in which electronic units and the like are mounted suffer serious drawbacks. Most importantly, they are susceptible to major damage in the event of a significant seismic event, and they are difficult and expensive to install. In accordance with the present invention, a rack assembly is provided which overcomes these drawbacks of known constructions.

SUMMARY OF THE INVENTION

The present invention provides a rack assembly for supporting a plurality of electronic units selectively mounted therein and intended for installation in a room having a permanent flooring and a secondary flooring having openings therein, with the secondary flooring being disposed above the permanent flooring to form a vertical spacing therebetween, in accordance with standard building practices. The rack assembly includes a generally rectangular frame having two side elements, a top element and a bottom element, and the frame is formed with openings therein through which electronic units can be mounted. A mounting portion is disposed at the lower end of the frame and has reinforcing members connected thereto, and the mounting portion has feet formed at the bottom thereof to permit the rack assembly to be secured directly to the permanent flooring. A bottom plate is fixed to the frame at the lower end thereof and is positioned to lie in a plane substantially parallel to the plane of the secondary flooring when the mounting portion is attached to the permanent flooring. Accordingly, the rack assembly can be fixed to the permanent flooring and extend upwardly through one of the openings in the secondary flooring without attachment thereto.

In the preferred embodiment of the present invention, the mounting portion of the rack assembly is provided with a plurality of reinforcing members disposed between the feet and the bottom plate, including two downwardly extending flat plates to which the feet are attached and a plurality of tubes extending vertically along the downwardly extending flat plates. Two cross braces may also be provided to extend diagonally between the bottom end of one the plates and the top of the other the plates. Also, the mounting portion has a vertical height corresponding to the vertical spacing between the concrete flooring and the secondary flooring.

Additionally, in the preferred embodiment of the present invention, a pair of flat side plates are fixed, preferably by welding, to the side elements of the frame and extend outwardly from both side edges thereof to provide reinforcing strength to the side elements, and these side plates are formed with a plurality of openings therein which are positioned to permit individual electrical wires to pass through one of the openings for connection to each one of the electronic units mounted in the rack assembly.

It is also preferred that the aforesaid flat bottom plate be formed with at least one opening positioned to permit cooling air to flow upwardly from the vertical spacing and into contact with any electronic units mounted in the frame, and that a flat top plate be fixed to the top element of the frame and extend outwardly from both sides thereof. Moreover the flat top plate may have upturned flanges at the outmost edges thereof forming a through for supporting and containing electrical wires associated with the electronic units supported in the rack assembly.

In one embodiment of the present invention, the side elements of the frame are V-shaped, with each leg being formed with the openings through which the electronic units can be mounted; in an alternate embodiment the side elements of the frame are U-shaped, with each leg portion being formed with the openings through which the electronic units can be mounted and with the bottom portion being formed with opening disposed adjacent to each of the positions at which the electronic units are mounted, whereby the U-shaped side element can serve as channels through which cooling air can be delivered to the electronic units mounted thereon.

In accordance with one feature of the present invention, the top, bottom and side elements of the frame are each provided with flat steel reinforcing plates extending outwardly therefrom as described above, and thereby forming a reinforcing rectangular box surrounding the frame, with the reinforcing rectangular box being disposed above the mounting portion. Accordingly, the rack assembly can be fixed to the permanent flooring and extend upwardly through one of the openings in the secondary flooring without attachment thereto and with the reinforcing rectangular box being disposed above the secondary flooring.

The present invention also contemplates a room construction for housing a plurality of the individual aforesaid rack assemblies that are arranged in the room with each rack assembly being supported directly to the permanent (e.g. concrete) flooring, with the mounting portion of the rack assemblies disposed between the permanent and secondary flooring, and with the frame portion of each rack assembly extending upwardly through an opening in the secondary flooring without attachment thereto. In this form of the present invention, it is preferred that at least some of the rack assemblies be arranged in side-by-side relationship with the side plates of one such rack assembly being disposed adjacent to and spaced from the side plate of another such rack assembly so as to form a channel therebetween for containing electrical wires extending to the electronic units.

Also, at least some of the rack assemblies can be arranged in side-by-side relationship with the flat top plates of one such rack assembly being disposed adjacent to and spaced from the top plate of another such rack assembly with the upstanding flanges of the top plates being disposed in parallel planes so as to form a channel therebetween for containing electrical wires extending between the rack assemblies.

DESCRIPTION OF THE PREFERRED EMBODIMENTS

Figure 1:
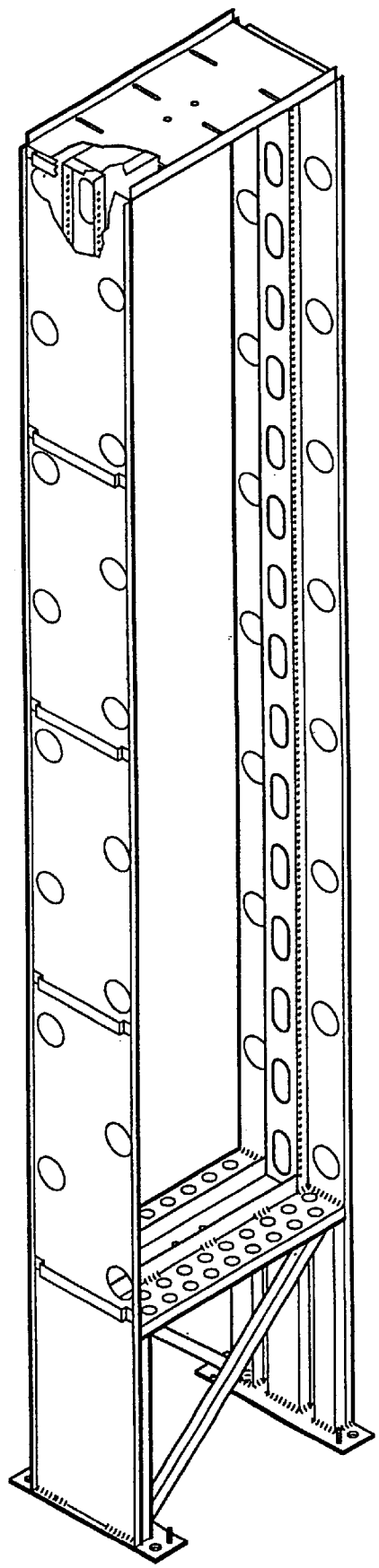
FIG. 1 is a perspective view of a rack assembly according to the present invention.

Looking now in greater detail at the accompanying drawings, FIG. 1 illustrates a preferred embodiment of a rack assembly 10 according to the present invention. It includes a generally rectangular frame 12 consisting of two side elements 14, a top element 16, and a bottom element 18, all of which include a large plurality of apertures or holes 20 for receiving mounting bolts (not shown) for attaching conventional electronic units (not shown) in vertically stacked relationship to one another within the frame 12, all in a fashion well-known in the art.

Figure 4:
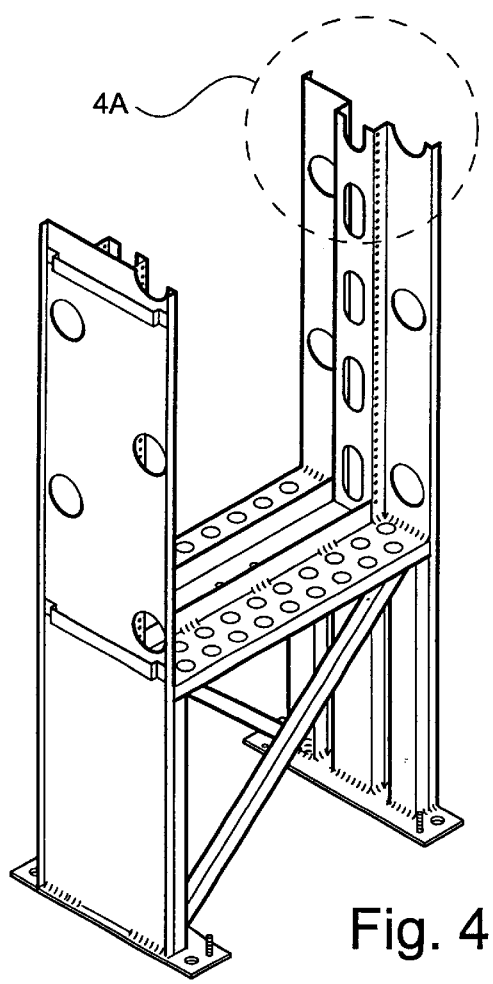
FIGS. 4 and 4(*a*) are detail views of one embodiment of the frame portion of the rack assembly of the present invention.
Figure 5A:
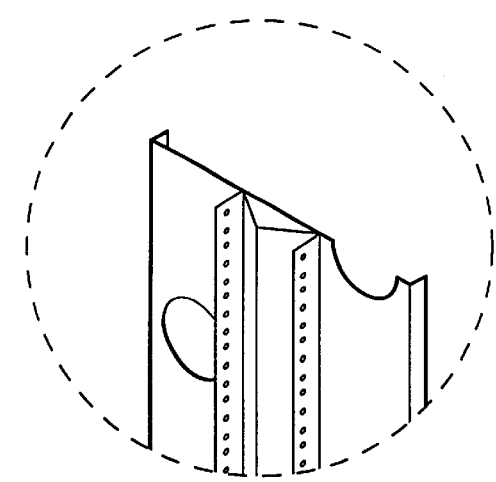
FIGS. 5 and 5(*a*) are detail views of another embodiment of the frame portion of the rack assembly of the present invention.
Figure 5:
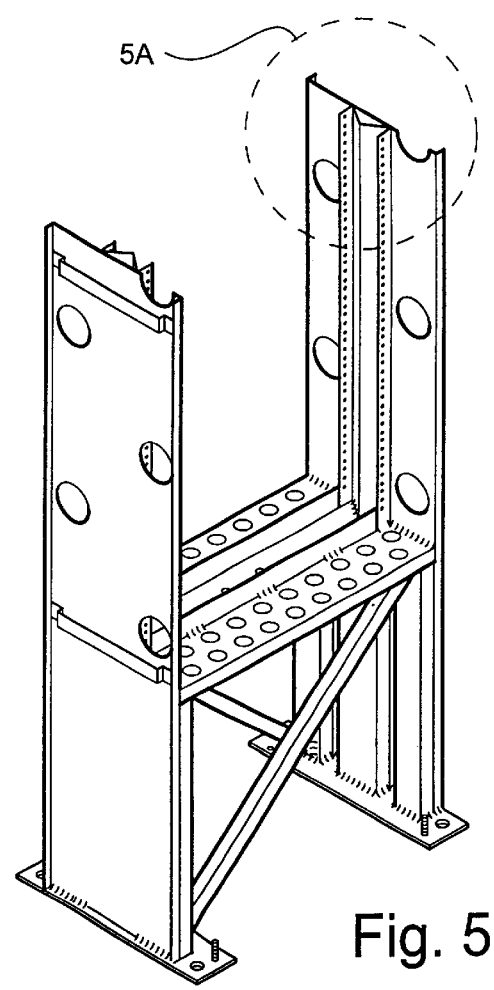

In one embodiment of the present invention, the side, top and bottom elements 14, 16 and 18 have a W-shaped configuration with the openings 20 extending through both legs of the elements as best illustrated in FIGS. 5 and 5(*a*). In an alternate embodiment of the present invention, which is best illustrated in FIGS. 4 and 4(*a*), the two side elements 14 of the frame 12 have a U-shaped configuration with the mounting holes 20 being formed in the two leg portions of the elements, and the bottom portion of the U-shaped elements are formed with enlarged openings 22 through which cooling air can flow in a manner to be described presently.

Each of the side elements 14 of the frame 12 has welded thereto, side reinforcing plates 24 that extend outwardly in both directions from the side elements 14 and which extend vertically along the full extent of the side elements 14. These side plates 24 are formed with openings 26 which are positioned to permit individual electrical wires to pass through such openings 26 for connection to one of the electronic units to be mounted in the rack assembly 10.

The bottom element 18 of the frame 12 is fixed, preferably by welding, to a flat bottom plate 28, and this plate 28 extends outwardly from each side of the bottom element 18 and is formed in both such side portions with a plurality of openings 30 having a purpose to be described presently.

The top element 16 of the frame 12 has attached thereto, preferably by welding, a flat top plate 32 which extends outwardly in both directions from the top element 16. The top plate 32 also has upturned flanges 34 at the outermost edges thereof, and these flanges 34, together with the flat portion of the top plate 32, form a trough for supporting and containing electrical wires associated with the electronic units to be supported in the rack assembly 10.

The rack assembly 10 also includes a mounting portion 36 which is disposed at the lower end of the frame 12. This mounting portion 36 consists of two downwardly extending flat plates 38, which are a continuation of the above-described side plates 24, and each plate 38 has a foot member 40 welded thereto at its bottom edge, the foot member 40 having connecting holes 42 formed therein. The mounting portion includes two reinforcing cross braces 44 which extend from the bottom of one of the downwardly extending plates 38 to the upper end of the other of such plates 38. Additionally, a plurality of reinforcing tube elements or channels 46 extend vertically along the inner surfaces of both of the downwardly extending plates 38.

In contrast to the difficult and expensive installation procedures for known rack assemblies as described above, the rack assembly of the present invention can be quickly and easily installed. More specifically, in looking at FIG. 2, the rack assembly 10 is illustrated in conjunction with a room having a typical permanent concrete floor 48 and secondary flooring 50, sometimes referred to as the computer floor, where rack assemblies of the type in question are installed, which is generally formed by plurality of tiles 52 removable mounted in a tile frame 52'. Again, in conventional structures of this type, the secondary flooring 50 is disposed approximately two feet above the concrete flooring 48 to provide a vertical space therebetween which can be used for a variety of known building construction functions.

To install the rack assembly 10 of the present invention, it is only necessary to remove one of the removable floor tiles 52, and then drop the mounting portion 36 of the rack assembly 10 through the opening created by the removal of the floor tile 52 and install the mounting portion 36 directly into the concrete flooring 48 using appropriate connecting bolts (not shown) which pass through the holes 42 in the foot members 40. Then, a portion of the removed tile 52 having dimensions slightly larger than the horizontal cross sectional area of the rack assembly 10 is cut away, and the tile 52 is then put back into the supporting floor tile frame. It will be apparent that this installation procedure can be done much more quickly, and much more inexpensively than conventional installation procedures which are described in detail above.

Figure 2:
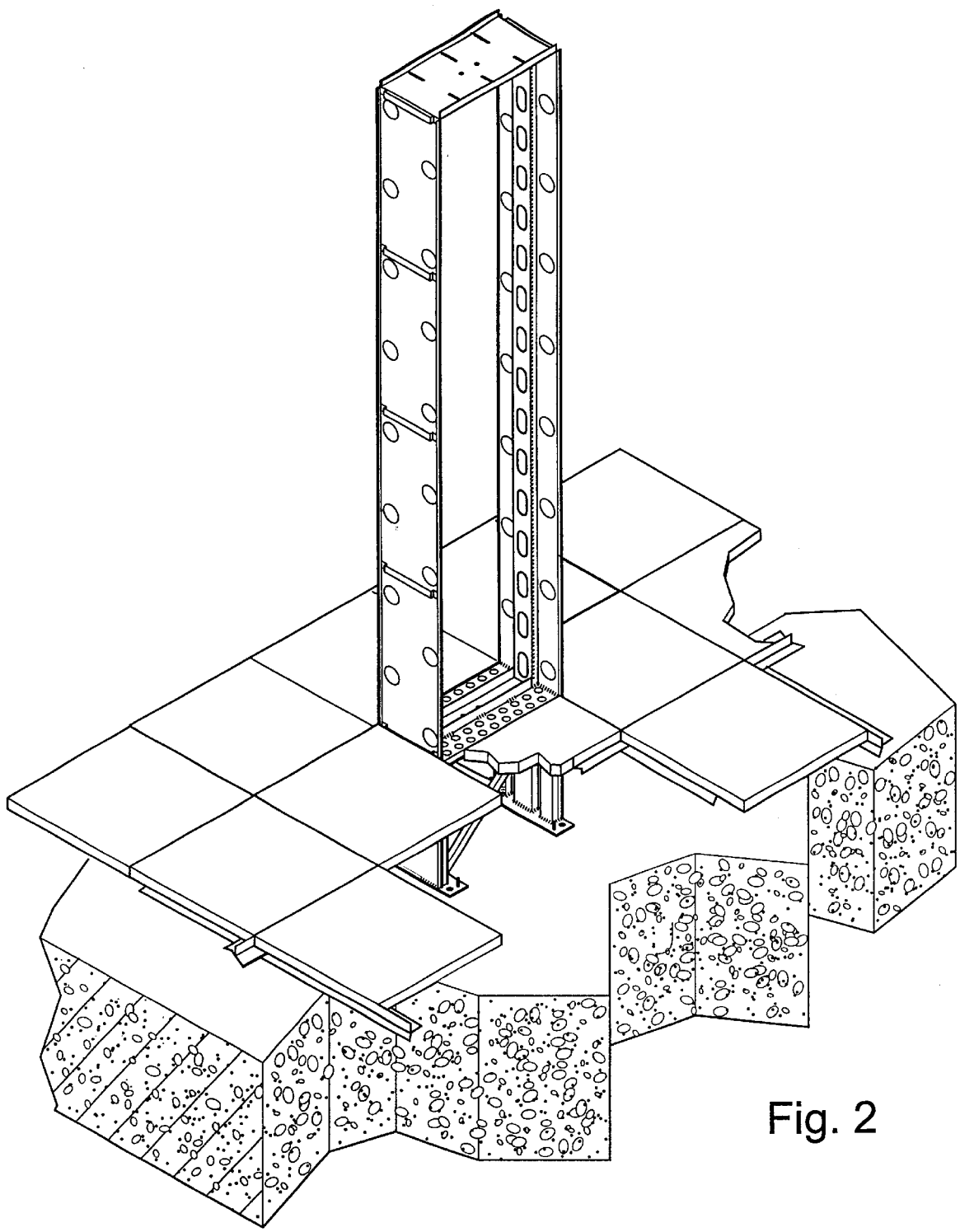
FIG. 2 illustrates the rack assembly shown in FIG. 1 mounted in place to a permanent floor.

As best seen in FIG. 2, after the rack assembly 10 has been installed, it is securely attached to the permanent concrete flooring 48 by the mounting portion 36, and it extends upwardly through an opening in the secondary or computer flooring 50 without any attachment to the computer floor 50. This is an important advantage in the event of an earthquake because the computer floor 50, which generally consists of a metal framework 52' and supported tiles 52, does not have the structural integrity of permanent flooring, and it therefore tends to buckle or collapse under the influence of significant seismic vibration. Obviously, if the rack assembly 10 were bolted or otherwise secured to the computer floor 50, it will tend to be twisted or otherwise corrupted by the buckled or collapsed computer floor 50.

Moreover, it will be noted that the mounting portion 36 of the rack assembly 10 has a vertical height corresponding generally to the spacing between the concrete flooring 48 and the computer floor 50 so that it can accept significant reinforcement members, such as the cross braces 44 and the tubes or channels 46, without interfering in any way with the frame 12 and its ability to properly support electronic units.

It will also be noted that the frame 12, which is disposed above the computer floor 50, has significant reinforcement capabilities, again without interfering in any way with the frame 12. Thus, each of the elements 14, 16 and 18 is welded to its own steel reinforcing plate 24, 32, and 28, respectively, which form a reinforcing rectangular box completely surrounding the frame 12, and this rectangular reinforcing box is disposed above the mounting portion 36 and above the computer floor 50. This box-like configuration of the plates 24, 28, and 32 and its location above the computer floor 50 combine nicely with the substantially reinforced mounting portion 36 below the computer floor 50 to provide the frame 12 and any electronic units mounted therein with extraordinary protection against earthquakes.

Figure 4A:
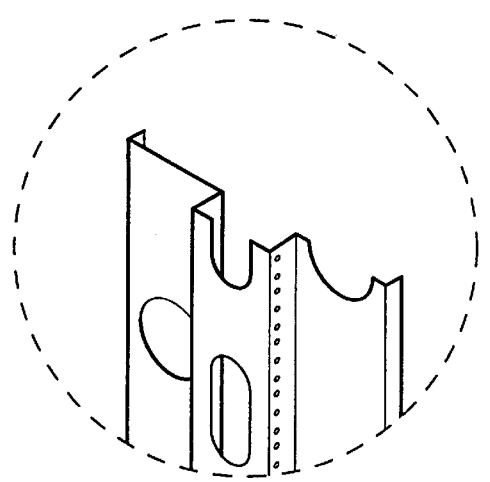

In accordance with another feature of the present invention, it will be noted that when the rack assembly 10 is mounted in place as shown in FIG. 2, the bottom plate 28 lies in the same plane as the computer floor 50 and substantially fills the opening in the computer floor 50 which is made to receive the rack assembly 10. Moreover, the openings 30 in the bottom plate 28 permit the cooler air that is usually present in the spacing between the concrete floor 48 and the computer floor 50 to flow upwardly and provide ambient cooling of the electronic units mounted in the rack assembly 10. If additional cooling is needed, the alternate embodiment of the side elements 14, which is illustrated in FIGS. 4 and 4(a) and described in greater detail above, may be utilized, in which case any suitable and conventional source of cooling air (not shown) can be pumped into the interior of the U-shaped side elements 14 to be discharged through the openings 22 and directed toward the electronic units mounted in the rack assembly 10.

Figure 3:
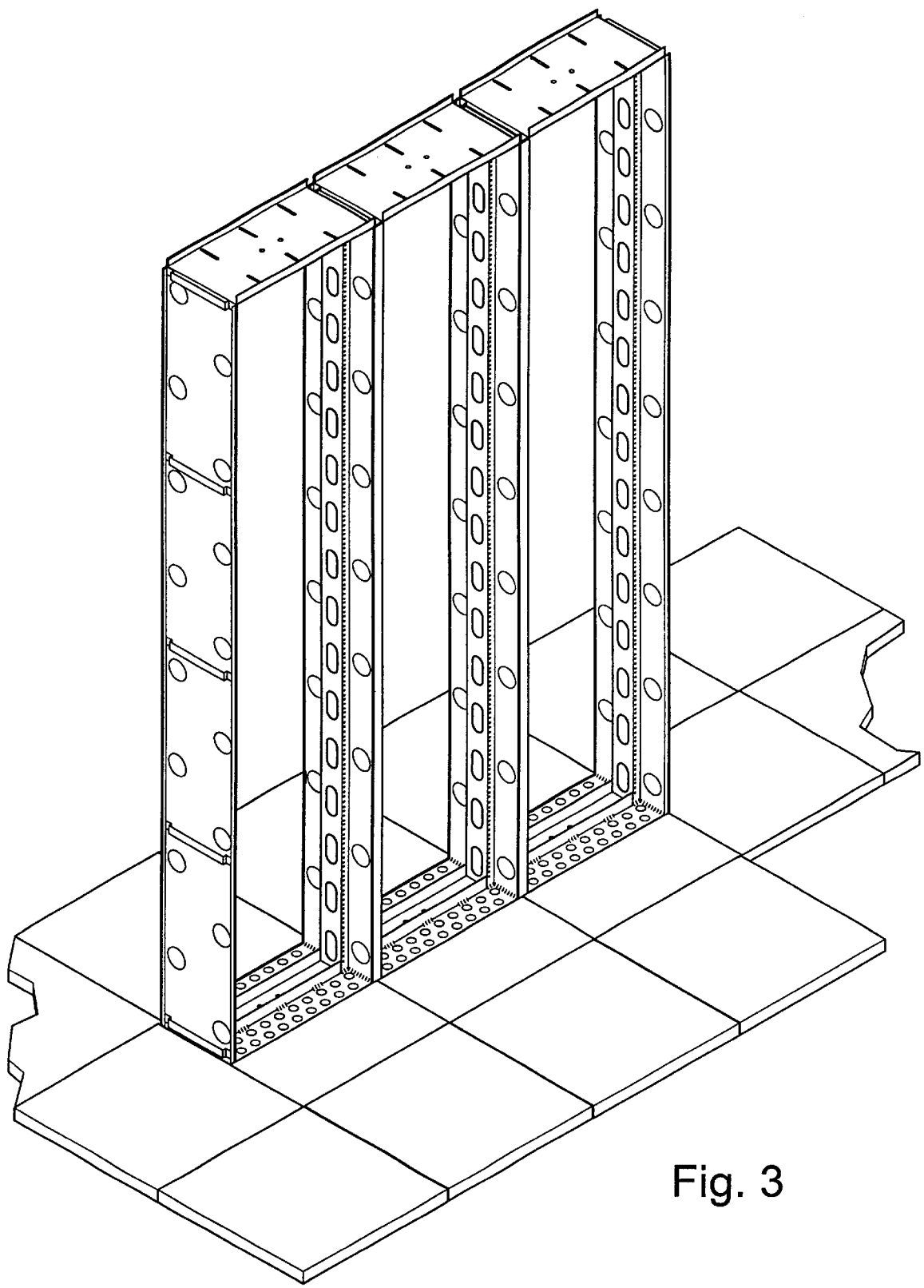
FIG. 3 is a illustrating a plurality of rack assemblies arranged in a room.

The rack assembly 10 of the present invention also takes advantage of the reinforcing side plates 24 and the reinforcing top plate 32 to provide wire maintenance capabilities without adding any additional construction. More specifically, and as best illustrated in FIG. 3, it is a common practice to use a plurality of rack assemblies 10 within a single room, and the rack assemblies 10 are also usually arranged in side-by-side arrangement to occupy as little floor space as possible while still providing convenient access to the electronic units mounted in the rack assemblies 10. It will be understood that the rack assemblies illustrated in FIG. 3 are secured to the concrete floor 50 to extend upwardly through the secondary floor 50 in the same manner as that illustrated in FIG. 2 and described above, and because the rack assemblies 10 are arranged in side-by-side arrangements, one of the side plates 24 of one of the rack assemblies 10 can be arranged and spaced in parallel relationship to a facing side plate 24 of an adjacent rack assembly 10 as illustrated in FIG. 3. These two side plates 24 form a natural channel through which the numerous electrical wires (not shown) can be contained and managed. If necessary or desired, it is a simple matter to also put a cover (not shown) over the spacings between the adjacent side plates 24 to more fully contain the electrical wires. In this same regard, it will also be noted that the openings 26 in the side plates 24 provide a convenient access opening through which individual electrical wires contained, between two adjacent side plates 24 can be passed to a connection with any one of the electronic units mounted in the rack assembly 10. This convenient wire management feature is in contrast to known rack assemblies of this general type which require the attachment of a separate wire management channel to each side of a rack assembly which not only increases the cost of the overall system, but also requires additional installation, time and expense.

As also best illustrated in FIG. 3, it will be noted that when rack assemblies 10 are mounted in side-by-side relationship, the top plates 32 thereof all lie in the same plane, and the upstanding flanges 34 similarly lie in the same plane. Accordingly, the troughs formed by these top plates 32 provide a convenient channel for managing electrical wires (not shown) which pass over the rack assembles 10 and which pass from one rack assembly 10 to another. Again, this convenient wire management feature is made available without installing or providing any additional structure to the existing rack assemblies 10.

It will be apparent from all of the above that the unique rack assembly 10 of the present invention provides a number of advantages, particularly with regard to its ability to withstand significant earthquake conditions, and the ease with which the rack assemblies 10 can be installed at a very modest expense.

It will, therefore, be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

What is claimed is:

1. A rack assembly for supporting a plurality of electronic units selectively mounted therein and intended for installation in a room having a permanent flooring and a secondary flooring having openings therein, said secondary flooring being disposed above said permanent flooring to form a vertical spacing therebetween, said rack assembly including:
   (a) a generally rectangular frame having two side elements, a top element and a bottom element, and said frame being formed with openings therein through which said electronic units can be mounted;
   (b) a mounting portion disposed at the lower end of said frame and having rigid reinforcing members forming a part of said mounting portion, said mounting portion having feet formed at the bottom thereof to rest on said permanent flooring and to be secured directly to said permanent flooring;
   (c) a bottom plate fixed to said frame at the lower end thereof and positioned to lie in a plane substantially parallel to said secondary flooring when said mounting portion is attached to said permanent flooring; and
   (d) a pair of flat side plates fixed to said side elements of said frame to extend outwardly from both side edges thereof to provide reinforcing strength to said side elements, whereby said rack assembly can be fixed to said permanent flooring and extend upwardly through one of said openings in said secondary flooring without attachment thereto.

2. A rack assembly as defined in claim 1, wherein said side plates are formed with a plurality of openings therein which are positioned to permit individual electrical wires to pass through one of said openings for connection to each one of said electronic units mounted in said rack assembly.

3. A rack assembly as defined in claim 1, wherein said side plates are welded to said frame.

4. A rack assembly as defined in claim 1, wherein said side elements of said frame are W-shaped with each leg being formed with said openings through which said electronic units can be mounted.

5. A rack assembly as defined in claim 1, wherein said side elements of said frame are generally U-shaped with each leg portion being formed with said openings through which said electronic units can be mounted and with the bottom portion being formed with opening disposed adjacent to each of the positions at which said electronic units are mounted, whereby said generally U-shaped side element can serve as channels through which cooling air can be delivered to said electronic units mounted thereon.

6. A rack assembly for supporting a plurality of electronic units selectively mounted therein and intended for installation in a room having a permanent flooring and a secondary flooring having openings therein, said secondary flooring being disposed above said permanent flooring to form a vertical spacing therebetween, said rack assembly including:
   (a) a generally rectangular frame having two side elements, a top element and a bottom element, and said frame being formed with openings therein through which said electronic units can be mounted;
   (b) a mounting portion disposed at the lower end of said frame, said mounting portion having feet formed at the bottom thereof to rest on said permanent flooring and having openings formed in said feet to permit said feet to be secured directly to said permanent flooring; and
   (c) a flat plate fixed to each of said two side elements, said top element and said bottom element of said frame to extend outwardly therefrom and thereby form a reinforcing rectangular box surrounding said frame, said rectangular box being disposed above said mounting portion, whereby said rack assembly can be fixed to said permanent flooring and extend upwardly through one of said openings in said secondary flooring without attachment thereto and with said reinforcing rectangular box being disposed above said secondary flooring.

7. A rack assembly as defined in claim 6, wherein said flat plates attached to said two side elements of said frame are formed with a plurality of openings therein which are positioned to permit individual wires to pass through one of said openings for connection to each one of said electronic units mounted in said rack assembly.

8. A rack assembly as defined in claim 6, wherein all of said flat plates are welded to said frame.

9. A rack assembly as defined in claim 6, wherein said flat plate attached to said bottom element of said frame is formed with at least one opening positioned to permit cooling air to flow upwardly from said vertical spacing and into contact with any electronic units mounted in said frame.

10. A rack assembly as defined in claim 6, wherein said mounting portion is provided with a plurality of reinforcing members disposed between said feet and said flat bottom plate, and it has a height corresponding to the vertical spacing between said permanent flooring and said secondary flooring.

11. A room for housing a plurality of electronic units, said room including:
   (a) a permanent floor;
   (b) a secondary floor disposed above said permanent flooring to form a vertical spacing therebetween, said secondary floor being formed with a plurality of opening therein;

(c) a plurality of rack assemblies, each of which includes
  (i) a generally rectangular frame having two side elements, a top element and a bottom element, and said frame being formed with openings therein through which said electronic units can be mounted; and
  (ii) a mounting portion disposed at the lower end of said frame and having a length corresponding generally to the height of said vertical spacing, said mounting portion having feet formed at the bottom thereof which are securely attached to said permanent flooring to position said rectangular frame so that it extends upwardly through one of said openings in said secondary flooring without attachment thereto, whereby each of said rack assemblies is supported independently of said secondary flooring.

12. A room for housing electronic units as defined in claim 11, wherein said mounting portion is provided with a plurality of reinforcing members disposed between said feet and said secondary flooring.

13. A room for housing electronic units as defined in claim 12, wherein said mounting portion includes two downwardly extending flat plates to which said feet are attached, and wherein said reinforcing members include two cross braces extending diagonally between the bottom end of one said plate and the top of the other said plate.

14. A room for housing electronic units as defined in claim 13, wherein said reinforcing members include a plurality of tubes extending vertically along said downwardly extending flat plates.

15. A room for housing electronic units as defined in claim 11, wherein a flat plate is fixed to each of said two side elements, said top element and said bottom element of said frame to extend outwardly therefrom and thereby form a reinforcing rectangular box surrounding said frame, said rectangular box being disposed entirely above said secondary flooring and being supported solely by said rectangular frame.

16. A room for housing electronic units as defined in claim 11, wherein a pair of flat side plates are fixed to said side elements of said frame and extend outwardly from both side edges thereof to provide reinforcing strength to said side elements.

17. A room for housing electronic units as defined in claim 16, wherein said side plates are formed with a plurality of openings therein which are positioned to permit individual electrical wires to pass through one of said openings for connection to each one of said electronic units mounted in said rack assembly.

18. A room for housing electronic units as defined in claim 16, wherein said side plates are welded to said frame.

19. A room for housing electronic units as defined in claim 16, wherein at least some of said rack assemblies are arranged in side-by-side relationship with said side plates of one such rack assembly be disposed adjacent to and spaced from said side plate of another such rack assembly so as to form a channel therebetween for containing electrical wires extending to said electronic units.

20. A room for housing electronic units as defined in claim 11, wherein at least some of said rack assemblies have a flat top plate secured to said top frame element and extending outwardly therefrom and have upstanding flanges formed at the outermost edges of said flat top plate forming a through for supporting and containing electrical wires associated with said electronic units supported in said rack assembly.

21. A room for housing electronic units as defined in claim 20, wherein at least some of said rack assemblies are arranged in side-by-side relationship with said flat top plates of one such rack assembly be disposed adjacent to and spaced from said side plate of another such rack assembly with the upstanding flanges of said rack assemblies being disposed in parallel planes so as to form a channel therebetween for containing electrical wires extending between said rack assemblies.

22. A room for housing electronic units as defined in claim 11, wherein at least some of said rack assemblies include a flat bottom plate fixed to said bottom element of said frame and extending outwardly therefrom, with the top surface of said flat bottom plate being in generally the same plane as the top surface of said secondary flooring.

23. A room for housing electronic units as defined in claim 22, wherein said flat bottom plates have a dimension slightly less than the dimensions of one of said openings in said secondary flooring.

24. A rack assembly for supporting a plurality of electronic units selectively mounted therein and intended for installation in a room having a permanent flooring and a secondary flooring having openings therein, said secondary flooring being disposed above said permanent flooring to form a vertical spacing therebetween, said rack assembly including:
  (a) a generally rectangular frame having two W-shaped side elements, a W-shaped top element and a W-shaped bottom element, with each said element being formed with openings therein through which said electronic units can be mounted;
  (b) a flat reinforcing plate fixed to each said frame element so as to extend outwardly therefrom and form a rectangular reinforcing box about said frame, with said flat plates attached to said side elements of said frame having openings therein positioned to permit individual electrical wires to pass through said openings for connection to said electronic units, with said flat plate attached to said bottom element having at least one opening therein to permit air to pass therethrough; and with said flat plate attached to said top element of said frame having upturned flanges at the outermost edges thereof forming a through for supporting and containing said electrical wires;
  (c) a mounting portion formed by two downwardly extending plates disposed at the lower end of said frame and below said flat plate attached to the bottom element of said frame, with said downwardly extending side plates having a length corresponding generally to the height of said vertical spacing between said permanent flooring and said secondary flooring, said mounting portion also having feet formed at the bottom of said downwardly extending plates to secure them to said permanent flooring and form the sole support between said rack assembly and said flooring, whereby said rack assembly can be fixed to said permanent flooring and extend upwardly through one of said openings in said secondary flooring without attachment thereto.

25. A rack assembly for supporting a plurality of electronic units selectively mounted therein and intended for installation in a room having a permanent flooring and a secondary flooring having openings therein, said secondary flooring being disposed above said permanent flooring to form a vertical spacing therebetween, said rack assembly including:
  (a) a generally rectangular frame having two side elements, a top element and a bottom element, and said frame being formed with openings therein through which said electronic units can be mounted; and (b) a mounting portion disposed at the lower end of said frame and including two downwardly extending flat plates and rigid reinforcing members, wherein said reinforcing members include two cross braces extending diagonally between the bottom end of one said plates and the top of the other said plates, whereby said rack assembly can be fixed to said permanent flooring and extend upwardly through one of said openings in said secondary flooring without attachment thereto such that the frame can be disposed entirely above the secondary flooring.

26. A rack assembly as defined in claim 25, wherein said reinforcing members include a plurality of tubes extending vertically along said downwardly extending flat plates.

\* \* \* \* \*